(12) United States Patent
Petkov et al.

(10) Patent No.: US 11,081,335 B2
(45) Date of Patent: Aug. 3, 2021

(54) METHODS FOR FORMING ELECTRONIC DEVICES FROM NANOMATERIALS

(71) Applicant: Milara Incorporated, Milford, MA (US)

(72) Inventors: Krassimir D. Petkov, Medway, MA (US); Velimir Deric, Franklin, MA (US); Haniel Olivera, Fitchburg, MA (US); Eugene Bonev, Santa Clara, CA (US)

(73) Assignee: Milara Incorporated, Milford, MA (US)

( * ) Notice: Subject to any disclaimer, the term of this patent is extended or adjusted under 35 U.S.C. 154(b) by 29 days.

(21) Appl. No.: 16/680,337

(22) Filed: Nov. 11, 2019

(65) Prior Publication Data

US 2020/0098560 A1    Mar. 26, 2020

Related U.S. Application Data

(60) Continuation of application No. 15/820,982, filed on Nov. 22, 2017, now abandoned, which is a division of
(Continued)

(51) Int. Cl.
| | |
|---|---|
| *H01L 21/02* | (2006.01) |
| *B82Y 40/00* | (2011.01) |
| *H01L 21/67* | (2006.01) |
| *H01L 21/677* | (2006.01) |
| *B05D 1/18* | (2006.01) |

(Continued)

(52) U.S. Cl.
CPC .......... *H01L 21/02107* (2013.01); *B05D 1/18* (2013.01); *B82Y 40/00* (2013.01); *H01L 21/67167* (2013.01); *H01L 21/67207* (2013.01); *H01L 21/67745* (2013.01); *B05D 3/0413* (2013.01); *B29C 65/7802* (2013.01);
(Continued)

(58) Field of Classification Search
CPC ..... B29C 65/7802; B29C 66/95; B82Y 40/00; H01L 21/02107; H01L 21/67167; H01L 21/67207; H01L 21/67745; H01L 29/0673; Y10S 977/84; B05D 1/18; B05D 3/0413
USPC .................... 156/235; 427/372.2, 430.1, 512
See application file for complete search history.

(56) References Cited

U.S. PATENT DOCUMENTS

| | | | | |
|---|---|---|---|---|
| 5,098,508 | A | * | 3/1992 | Mattil ...................... A43D 5/02 12/122 |
| 8,404,169 | B2 | * | 3/2013 | Kawakami ............ G03F 7/0002 264/293 |

(Continued)

*Primary Examiner* — Sonya M Sengupta
(74) *Attorney, Agent, or Firm* — Nelson Mullins Riley & Scarborough LLP; Anthony A. Laurentano

(57) ABSTRACT

A multi-scale manufacturing system comprising a centrally located multi-axis and multi-dimensional first manipulating component associated with a housing for manipulating a substrate and a template, a control subsystem coupled to the first manipulating component for controlling movement thereof, a pre-alignment subsystem for pre-aligning the substrate and the template, an assembly station for applying nanomaterial to the template, an alignment station for aligning the template and the substrate together to form a workpiece assembly, and a transfer subsystem for applying pressure to the workpiece assembly for transferring the nanomaterial from the template to the substrate.

6 Claims, 6 Drawing Sheets

Related U.S. Application Data application No. 15/269,752, filed on Sep. 19, 2016, now Pat. No. 10,418,235.

(60) Provisional application No. 62/220,113, filed on Sep. 17, 2015.

(51) Int. Cl.

| | | |
|---|---|---|
| *B29C 65/00* | (2006.01) | |
| *B29C 65/78* | (2006.01) | |
| *H01L 29/06* | (2006.01) | |
| *B05D 3/04* | (2006.01) | |

(52) U.S. Cl.
CPC .......... *B29C 66/95* (2013.01); *H01L 29/0673* (2013.01); *Y10S 977/84* (2013.01)

(56) References Cited

U.S. PATENT DOCUMENTS

| | | | | |
|---|---|---|---|---|
| 8,668,978 B2* | 3/2014 | Malima | ............... | G01N 33/5438 428/172 |
| 8,703,501 B2* | 4/2014 | Mead | ................ | C25D 5/02 436/149 |
| 8,784,673 B2* | 7/2014 | Xiong | ................ | B82Y 30/00 216/17 |
| 8,937,293 B2* | 1/2015 | Busnaina | ................ | C25D 13/00 257/9 |
| 2007/0108163 A1* | 5/2007 | Hattori | ............... | G11B 23/0057 216/85 |
| 2007/0262049 A1* | 11/2007 | Miyajima | ............... | B29C 43/18 216/11 |
| 2008/0156365 A1* | 7/2008 | Scholz | ................ | H01L 31/048 136/251 |
| 2009/0087622 A1* | 4/2009 | Busnaina | ............... | B82Y 30/00 428/173 |
| 2010/0052217 A1* | 3/2010 | Kasumi | ................ | B29C 43/021 264/293 |
| 2012/0306122 A1* | 12/2012 | Hoshino | ................ | B29C 33/44 264/446 |
| 2013/0207309 A1* | 8/2013 | Okada | .................... | B29C 33/44 264/293 |
| 2014/0318967 A1* | 10/2014 | Busnaina | ............... | C25D 13/00 204/485 |
| 2017/0080693 A1* | 3/2017 | Petkov | ............. | H01L 21/67207 |

* cited by examiner

METHODS FOR FORMING ELECTRONIC DEVICES FROM NANOMATERIALS

RELATED APPLICATIONS

The present application is a Continuation patent application based on U.S. patent application Ser. No. 15/820,982, filed Nov. 22, 2017, which is a Divisional patent application based on U.S. patent application Ser. No. 15/269,752, filed Sep. 19, 2016, now U.S. Pat. No. 10,418,235, issued Sep. 17, 2019, which claims priority to U.S. Provisional Patent Application Ser. No. 62/220,113, filed Sep. 17, 2015, entitled SYSTEMS AND METHODS FOR FORMING ELECTRONIC DEVICES FROM NANOMATERIALS, the contents of which are herein incorporated by reference.

BACKGROUND OF THE INVENTION

The fields of nanoscience and nanotechnology generally concern the synthesis, fabrication and use of nanoelements and nanostructures at atomic, molecular and supramolecular levels. The nanosize of these elements and structures offers significant potential for research and applications across the scientific disciplines, including materials science, physics, chemistry, computer science, engineering and biology. Biological processes and methods, for example, are expected to be developed based entirely on nanoelements and their assembly into nanostructures. Other applications include developing nanodevices for use in semiconductors, electronics, photonics, optics, materials and medicine, and the like.

In particular electronic elements can be fabricated from nanomaterials using certain selected techniques that are modified to handle and manipulate the nanoscale material. One class of materials that has garnered considerable interest are carbon nanotubes. A carbon nanotube has a diameter on the order of nanometers and can be several micrometers in length. These nanoelements feature concentrically arranged carbon hexagons. Carbon nanotubes can behave as metals or semiconductors depending on their chirality and physical geometry.

Although carbon nanotubes have been assembled into different nanostructures, only limited nanotools and fabrication methods for their assembly have been developed. One obstacle has been the manipulation of individual nanoelements, which is often inefficient and tedious. This problem is particularly challenging when assembling complex nanostructures that require selecting and ordering millions of nanoelements across a large area.

Current nanostructure assembly has focused on dispersing and manipulating nanoelements using atomic force or scanning tunneling microscopic methods. Although these methods are useful for fabricating simple nanodevices, neither is practical when selecting and patterning, for example, millions of nanoelements for more complex structures. As an alternative, lithographic methods have been developed to modify substrates used for assembling nanoelements. Examples of these lithographic methods include, but are not limited to, electron-beam, ion-beam, extreme ultraviolet and soft lithographies. These methods, however, remain incapable of manipulating individual nanoelements. The development of nanomachines or "nanoassemblers" which are programmed and used to order nanoelements for their assembly holds promise, although there have been few practical advancements with these machines to date.

Self-assembly is a method for nanodevice fabrication that does not require nanoelements to be individually manipulated. In self-assembly, nanoelements are designed to naturally organize into patterns by atomic, molecular and supramolecular particle interactions. Self-assembled monolayers, for example, are formed by the spontaneous arrangement of molecules into monomolecular layered structures. These structures can be stabilized by van der Waals forces or other forms of noncovalent bonding. Self-assembled monolayers, however, have been problematic when used to transfer nanoelements from one nanosubstrate to a recipient substrate. Although particle interactions can be modified to affect their transport, optical and electrical properties, controlling nanoelement orientation is also a challenge in self-assembly methods. Similarly, nanoscience has been incapable of manipulating particle interactions to reproducibly assemble hundreds of nanodevices.

Further, conventional manufacturing techniques have failed to integrate nanoscale processes and nanomaterials into products. Conventional prior art approaches such as inkjet printing, gravure type printing, and screen printing have been used to create structures using nanomaterials. However, these processes are quite slow, are not readily scalable, do not provide sufficient high rate throughput and typically only provide micron scale resolution.

SUMMARY OF THE INVENTION

The present invention is directed to a system and method of fabricating devices, including nanodevices, from nanomaterial. The system of the present invention provides multiple different processing stations or subsystems that communicate with a central workpiece manipulating component, such as a multi-dimensional and multi-axis robot arm. The system is adapted to apply nanomaterial to a template and then transfer the nanomaterial from the template onto a substrate. The system can perform this function by using a multi-scale offset printing process or other known transfer techniques suitable for use with nanoscale material.

The system and method of the present invention includes a centrally located multi-axis and multi-dimensional manipulating component mounted within a housing for manipulating a workpiece during processing of the workpiece. The housing and manipulating component form a manipulation station or subsystem. The system and method of the present invention involves storing one or more workpieces in a loading subsystem, station or module that is coupled to the manipulating component housing. According to the present invention, the workpieces are stored together or separately in the loading station. The loading station can include a plurality of vertical stacks or racks that have a plurality of shelves, each adapted to hold and store a workpiece, such as a substrate and/or a template.

The manipulating component removes a substrate from the loading station and places the substrate in a pre-alignment station or subsystem. The pre-alignment station pre-aligns the substrate to a particular processing position according to known techniques, and then the manipulating component removes the substrate and places the substrate in an alignment station or subsystem for temporary storage.

The manipulating component of the manipulation station then retrieves a template from the loading station and then transfers the template to the pre-alignment station where the template is also pre-aligned prior to processing. The manipulating component then retrieves the template and transfers the template to an assembly station or sub-system. The assembly station includes a housing having multiple tanks or reservoirs and a second manipulating component for receiving the template from the manipulating component of the manipulation station. The second manipulating component receives the template from the first manipulating component, and then orients the template vertically for submersion in a first reservoir or tank having a fluid and nanomaterial mixture contained therein. The second manipulating element can function as a first electrode and a second electrode can be electrically coupled to the first reservoir. The template is submerged in the fluid and an electric field created within the fluid between the two electrodes attracts the nanomaterial contained therein to selected pre-defined areas of the template. The second manipulating component then removes the template from the first reservoir and then translates the template horizontally until the template is positioned over a second adjacent reservoir. The second manipulating component then moves vertically downwardly placing the template in the second reservoir which functions as a drying stage. Air jets disposed within the reservoir air dry the template to remove any water therefrom.

The manipulating component of the manipulation station then retrieves the template from the assembly station and then places the template within the pre-alignment station so as to, once again, pre-align the template. The manipulating component then transfers the template from the pre-alignment station to the alignment station. In the alignment station, the template and the substrate are aligned with each other according to known techniques to form a workpiece assembly.

The manipulating component then transfers the workpiece assembly to a transfer module, where the substrate and the template are pressed together employing suitable pressure applying techniques so as to transfer the nanomaterial from the template to the substrate. The substrate and the template are then separated by suitable structure within the transfer station and then the template and the substrate are separately transferred by the manipulating component back to the loading station.

According to the present invention, a multi-scale manufacturing system includes a centrally located multi-axis and multi-dimensional first manipulating component associated with a housing for manipulating a substrate and a template, a control subsystem coupled to the first manipulating component for controlling movement thereof, a pre-alignment subsystem for pre-aligning the substrate and the template, an assembly station for applying nanomaterial to the template, an alignment station for aligning the template and the substrate together to form a workpiece assembly, and a transfer subsystem for applying pressure to the workpiece assembly for transferring the nanomaterial from the template to the substrate. The multi-axis and multi-dimensional manipulating component comprises a robotic arm.

The assembly station includes a first reservoir that contains a fluid having nanomaterial and a second reservoir having a plurality of air jets for air drying the template. The assembly station further comprises a second manipulating component for manipulating the template when received from the first manipulating component, wherein the second manipulating component places the template into the first reservoir containing the nanomaterial for applying the nanomaterial thereto, and then subsequently places the template into the second reservoir for drying the template.

Further, the housing of the multi-axis and multi-dimensional manipulating component has a hexagonal shape, and the control subsystem, the pre-alignment subsystem, the alignment subsystem, the assembly subsystem and the transfer subsystem are clustered about the housing.

The present invention is also directed to a method for fabricating a nanostructure from nanomaterial. The fabrication method includes providing a centrally located multi-axis and multi-dimensional first manipulating component associated with a housing for manipulating a substrate and a template, placing the substrate in a pre-alignment subsystem for pre-aligning the substrate, removing the substrate from the pre-alignment subsystem and the placing the substrate in an alignment subsystem, pre-aligning the template, removing the template from the pre-alignment subsystem and then transferring the template to an assembly subsystem, applying nanomaterial to the template in the assembly subsystem to form the nanostructure, drying the template once the nanomaterial is applied thereto in the assembly subsystem, and removing the template from the assembly subsystem with the first manipulating component and then transferring the template to the alignment subsystem. The method also includes aligning the template with the substrate to form a workpiece assembly and transferring the workpiece assembly with the first manipulating component from the alignment subsystem to a transfer subsystem. When in the transfer subsystem, the nanomaterial is transferred from the template to the substrate and then the template is separated from the substrate. The substrate and the template are then transferred from the transfer assembly by the first manipulating component.

According to the present invention, when the template is processed in the assembly subsystem, the template is placed in a first reservoir containing the nanomaterial by a second manipulating component, the template is removed from the first reservoir with the second manipulating component and is translated horizontally thereby, and then the template is placed in a second reservoir to air dry the template. The template is removed from the second reservoir with the second manipulating component, and then transferred from the second manipulating component to the first manipulating component. When the workpiece assembly is processed in the transfer subsystem, the transfer assembly applies pressure to the workpiece assembly so as to transfer the nanomaterial from the template to the substrate. Subsequently, air pressure is applied between the template and the substrate so as separate the template from the substrate.

The present invention also contemplates forming nanowells on the template for holding the nanomaterial. Also, the present invention involves clustering the pre-alignment subsystem, the alignment subsystem, the assembly subsystem and the transfer subsystem about the first manipulating component.

BRIEF DESCRIPTION OF THE FIGURES

These and other features and advantages of the present invention will be more fully understood by reference to the following detailed description in conjunction with the attached drawings in which like reference numerals refer to like elements throughout the different views. The drawings illustrate principals of the invention and, although not to scale, show relative dimensions.

DETAILED DESCRIPTION

Figure 1:
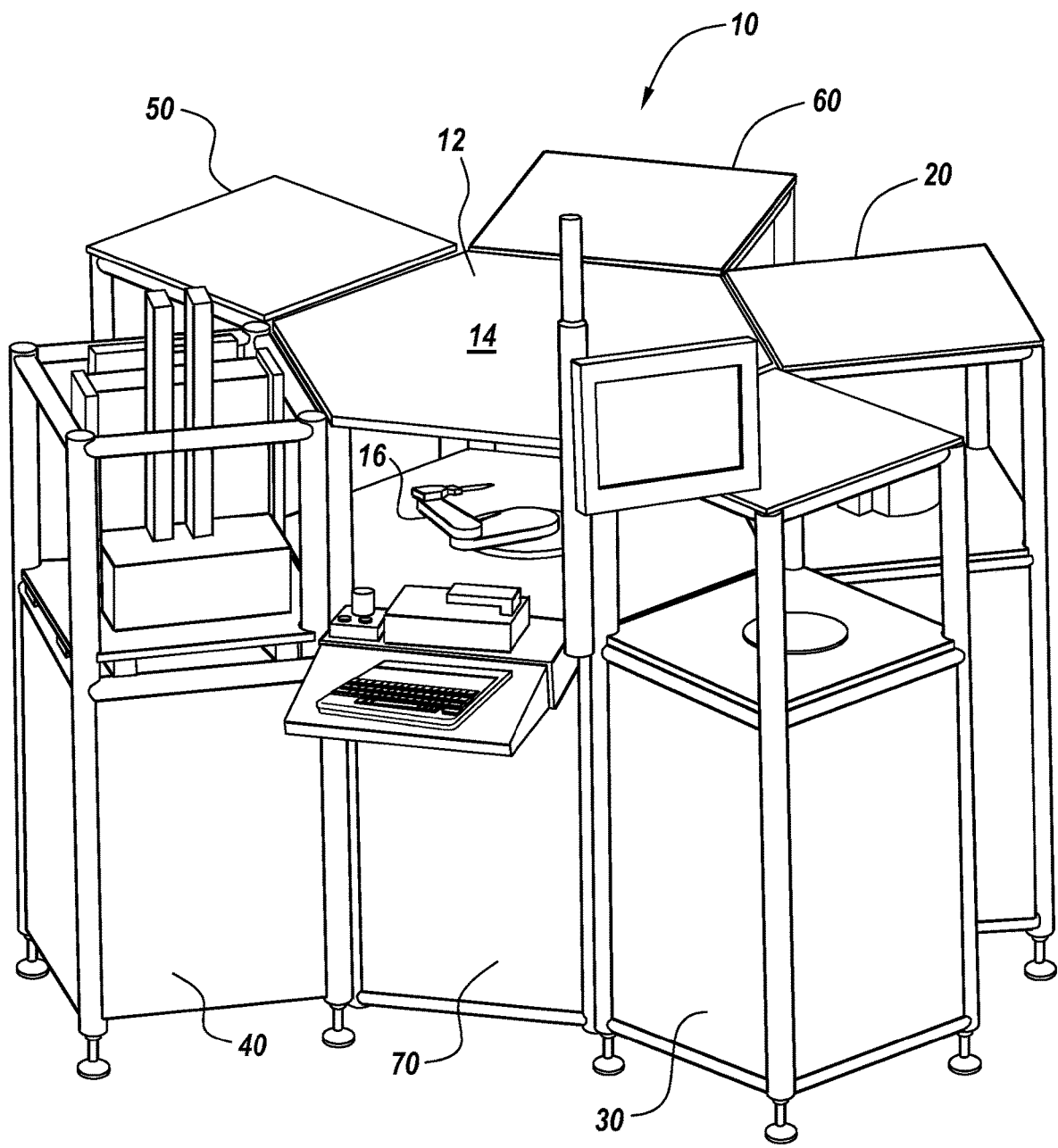
FIG. 1 is a perspective view of a multi-scale manufacturing system for generating devices, including nanodevices, from nanomaterial according to the teachings of the present invention.

The present invention is described in detail below. First, we set forth definitions of selected terms that may be used throughout the specification and associated claims.

The articles "a" and "an" are used herein to refer to one or to more than one (i.e., to at least one) of the grammatical object of the article. By way of example, "an element" means one element or more than one element.

The term "or" is used herein to mean, and is used interchangeably with, the term "and/or," unless context clearly indicates otherwise.

The term "about" is used herein to mean a value − or +20% of a given numerical value. Thus, "about 60%" means a value of between 60−(20% of 60) and 60+(20% of 60) (i.e., between 48 and 70).

As used herein, the term "nanomaterial" is intended to include natural and synthetic nanoscale materials or structures, such as nanoparticles, fullerenes such as nanotubes, including carbon or silicon nanotubes, polystyrene and PLGA polymer, PSL or silica nanoparticles, metallic particles, polymers, graphene, and the like. Examples of nanoparticles include nanocrystals, quantum dots, nanorods, and nanowires, biological and chemical material, metallic particles, and other known materials and structures. The nanomaterial can be used to construct nanodevices, such as nanoelements, nanostructures, and/or nanofilms, or devices of larger scale. Further, the nanomaterial can be used to form an interconnect according to the present invention. The nanotubes can be multi walled or single walled nanotubes (SWNT) and can behave like metals as in known in the art. Examples of interconnect structures formed using carbon nanotubes are described in U.S. Pat. No. 8,937,293, the contents of which are herein incorporated by reference.

As used herein, the term "nanoscale" refers to a size or dimension of an object or a portion of an object in the range from about 1 nm to about 1000 nm. The term "microscale" as used herein refers to a size or dimension of an object or a portion of an object in the range from about 1 μm to about 1000 μm.

A "nanofilm" as used herein means a film having a thickness in the nanoscale range and a surface area that is any size. A nanofilm according to the present invention is deposited by a method of the invention, and the nanofilm can be used either as an end product, as deposited, or as a raw material that is gathered and stored or transported for later use, such as incorporation into a circuit or other device. While the nanoelement assemblies according to the invention are generally flat, and are thus termed nanofilms, they may also take a more compact form (e.g., when deposited in a narrow nanoscale trench) and can be termed "nanowires".

The term "substrate" as used herein refers to a solid material upon which nanomaterial is deposited to form a nanostructure or nanofilm or other like nanoscale structure by a method according to the present invention. A substrate is generally flat but can have any dimensions according to its anticipated use. The substrate can be of any suitable material, but usually the substrate contains a material such as silicon, silicon oxide or dioside, or a hydrophobic polymer such as parylene-C or polyethylene terephthalate (PET). The substrate has a hydrophobic surface that can be rendered hydrophilic by a plasma etching technique, if desired. The substrate can be homogeneous throughout or it can have a layered structure. If layered, the uppermost substrate layer is preferably hydrophobic.

The present invention is directed to a multi-scale offset printing process and associated systems based on directed assembly and nanomaterial transfer from a template to a substrate. A reusable template, such as a damascene template, can be employed for high-yield and high-rate assembly and transfer of nanomaterial. The template can be fabricated using a hard substrate, such as a silicon wafer, or a flexible substrate, such as polyimide or PET, thereby enabling continuous manufacturing systems, such as a roll-to-roll system.

Electrophoresis can be used to assemble various nanodevices, such as nanoelements or nanostructures such as polymer nanoparticles, silica nanoparticles, carbon nanotubes (single and multi-wall) or organic molecules on the template. These techniques can be performed with a high degree of control, and transfer printing can be used to transfer the assembled nanoelements from the template to a recipient substrate. Furthermore, to ensure uniformity during assembly the templates can be reusable and can be designed so that all micro/nano conductive patterns have the same or similar electrical properties during the assembly stage.

The present invention provides, at least in part, a system and method to form, create, or manufacture, and assemble, one or more nanodevices from nanomaterial using a patterned substrate, in a controlled and precise manner using selected electrophoretic techniques, such as DC electrophoresis. This method can assemble nanomaterial, such as for example nanotubes and nanoparticles, over larger dimensions (e.g., nanoscale, microscale or larger such as macroscale) than previously possible, and in a relatively shorter period of time (e.g., minutes). Furthermore, previous techniques required using wires having diameters in at least the micron range for generating the electric field. The present invention employs, however, nanoscale conductors that align and assemble nanoelements by DC electrophoresis. An example of nanoscale conductors that can be employed to directly assemble nanomaterial on a substrate employing DC electrophoresis is disclosed in U.S. Pat. No. 8,668,978, the contents of which are herein incorporated by reference.

Figure 2:
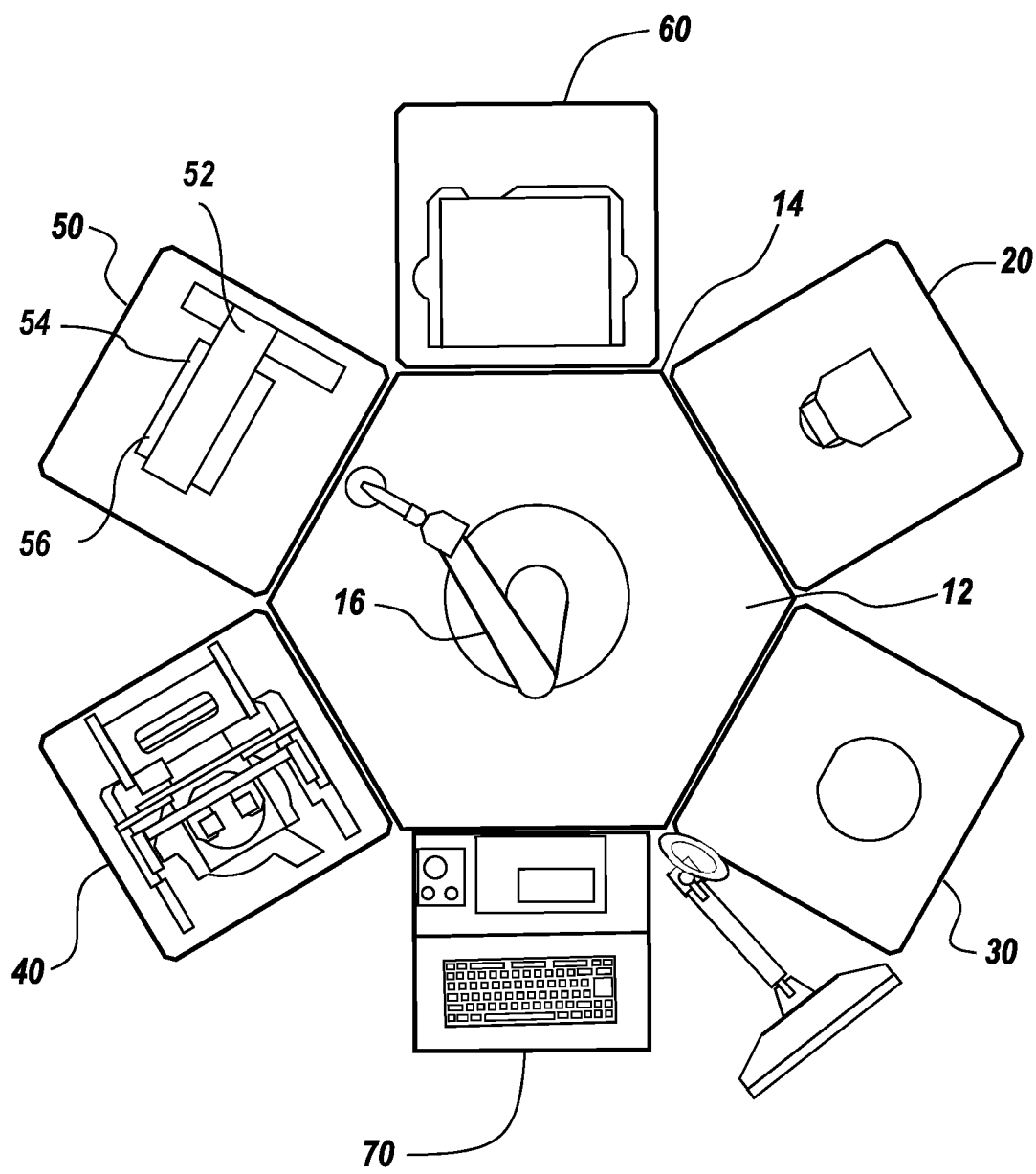
FIG. 2 is a top view of the multi-scale manufacturing system of FIG. 1 according to the teachings of the present invention.

The multi-scale manufacturing system 10 of the present invention is illustrated in FIGS. 1 and 2. The multi-scale system is intended to manufacture nanodevices, such as nanoelements, nanostructures, nanofilms and other like nanoscale products, in large quantities in relatively short periods of time without requiring high capita costs typically associated with the manufacture of electronic components. For the sake of simplicity, we simply refer to these various nanoscale products produced by the illustrated multi-scale system as nanodevices or nanostructures in the following disclosure.

The multi-scale manufacturing system 10 includes a centrally located workpiece manipulating subsystem or module 12 that is housed within a central frame or housing 14. The housing includes a multi-axis and multi-dimensional manipulating component 16, such as a robotic arm, that is adapted to receive, handle and transfer workpieces processed by the system 10. The manipulating component is preferably adapted to handle workpieces, such as substrates and templates, employed in the system with a relatively high degree of precision and dexterity. In this regard, the manipulating component can employ high precision motion controllers and servo motors that allow for the relatively smooth handling of components. An example of a suitable manipulating component suitable for use with the present invention is the Diamond H3 handling robot manufactured and sold by Milara, Inc., USA. The housing 14 can have any selected shape or configuration, and is specifically configured to allow other subsystems to be clustered around or about the central housing. According to a preferred embodiment, the housing 14 has a hexagonal shape, although those of ordinary skill in the art will readily recognize that other configurations that promote the clustering of subsystems about a central housing can also be employed. The remaining subsystems can be disposed immediately adjacent to or can contact the central housing 14.

The multi-scale manufacturing system 10 includes a control station or subsystem 70 that can include computing suitable hardware and software for operating one or more components or subsystems of the multi-scale manufacturing system 10. The control station can include for example a computing device, such as a computer, a user interface such as a display, and an input device such as a keyboard and mouse. The control station allows an operator to program the system 10 to process a selected number of substrates according to one or more defined sequences. Further detailed information regarding the control station is provided below.

The illustrated multi-scale manufacturing system 10 includes a workpiece loading and storage station or subsystem 20. The workpieces stored and loaded in the loading station include substrates and/or templates, and can be housed in one or more vertically extending racks, where each rack includes a plurality of slots, each of which is adapted to house or store a selected workpiece. If the workpiece is a template, then the template is used to mount thereto the nanomaterial. If the workpiece is a substrate, then the substrate can function as the receiving or transferring member.

The manipulating component 16 initially moves for example a substrate from one of the stacks in the loading station 20 to the pre-alignment station or subsystem 30 so as to pre-align the substrate. The pre-alignment station 30 is necessary to help ready the substrate for processing by locating and precisely positioning the substrate for subsequent processing. Examples of pre-alignment modules suitable for use with the present invention include the line of pre-aligner systems manufactured and sold by Logosol, Inc.

The manipulating component 16 then retrieves the pre-aligned substrate and removes it from the pre-alignment station 30 and transfers the substrate to the alignment station or subsystem 40. The alignment station 40 can employ high precision viewing optics to help locate and/or view selected locating marks and hence align the substrate with a high degree of precision. The substrate is aligned in this module with a subsequently loaded template as part of a nanoscale offset printing process. The system can employ optical markers and the like on the substrate to ensure that the substrate is initially disposed in a suitable alignment position and properly aligned with the template. The substrate can be retained within the module by any suitable pneumatic system that can apply a selected vacuum to the substrate while awaiting subsequent loading of the template. Examples of aligner systems, commonly referred to as mask aligners, suitable for use with the present invention include the NXQ8000 series mask aligner systems manufactured and sold by Neutronix, Inc.

According to one aspect of the present invention, a bottom chuck portion of the alignment station 40 can have a platen design with embedded pins. The pins lift the substrate or template from the bottom chuck to an upper chuck and pneumatically held therein for temporary storage. The pins can be operated through any selected pneumatic system. Further, the workpieces (e.g., substrates and templates) can be handled at the edges to ensure a relatively clean and safe transfer and manipulation of the workpiece. Since the substrate can be temporarily stored in the upper chuck portion of the alignment station, the template and the substrate can be introduced to the station at different times by the manipulating component 16, which functions as a first manipulating component.

The manipulating component 16 then retrieves a template from the pre-alignment station 30 which can be adapted to store a plurality of templates in an upper portion of the housing. Alternatively, the templates can be stored in the loading station 20. The templates can be multi-layered structures that can have formed thereon selected patterns that are adapted to house and store the nanomaterial during the formation of the nanostructures. The template is also moved to a lower portion of the housing of the pre-alignment station where it is pre-aligned, similar to the substrate.

The templates as discussed herein can be formed according to known techniques. For example, the present invention contemplates the use of a template that employs a patterned substrate, such as a nanosubstrate. The nanosubstrate can be formed in a controlled and precise manner using known electrophoretic techniques. According to one practice, a template can be formed using trenches or nanowells to hold and retain the nanomaterial for subsequent transfer to the substrate. Examples of templates of this type are shown and described in U.S. Publication No. 2009/0087622, the contents of which are herein incorporated by reference. The templates of the present invention can be reused according to known techniques.

Figure 3A:
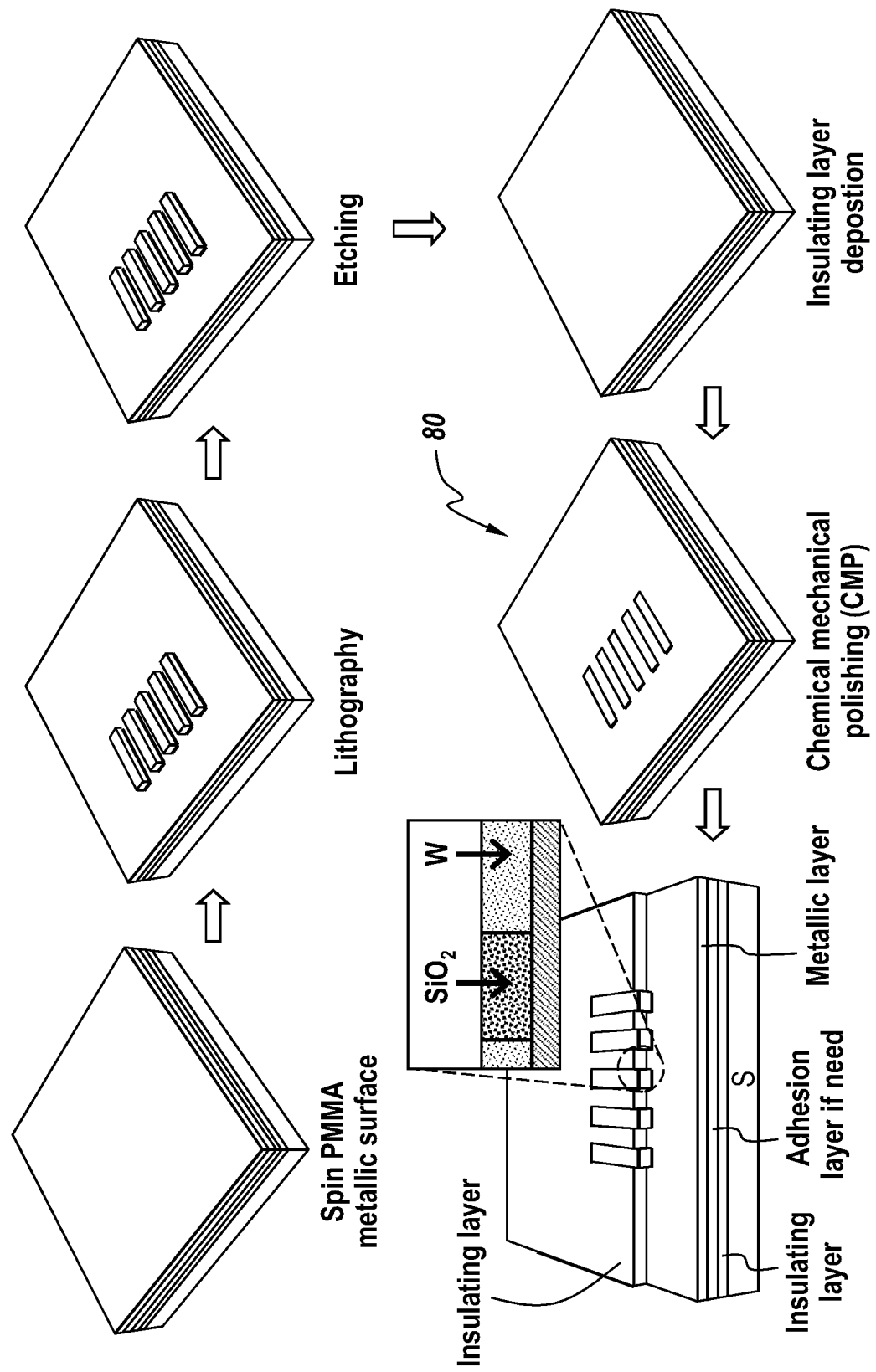
FIG. 3A is a schematic representation of a process for fabricating a damascene template suitable for use with the system of the present invention.
Figure 3B:
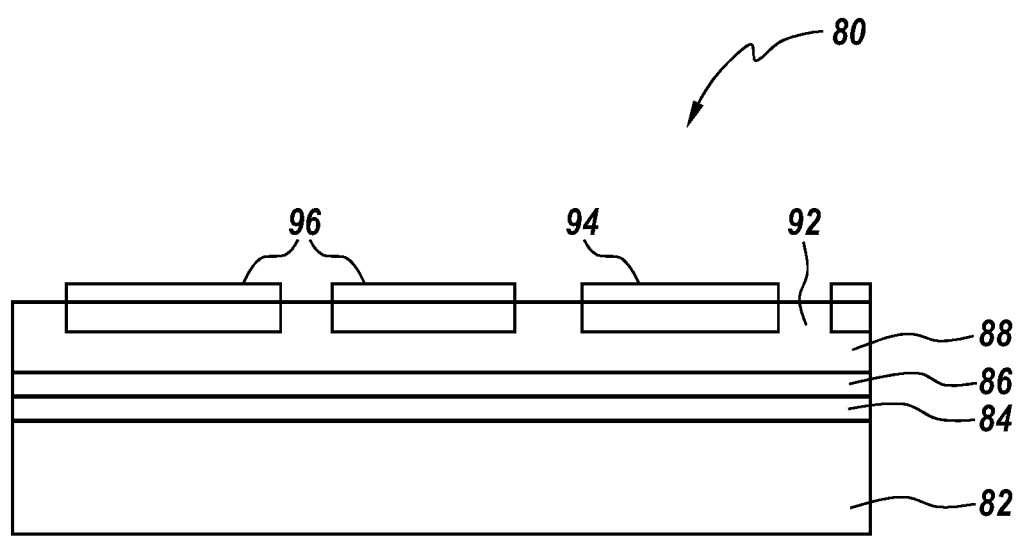
FIG. 3B is a schematic representation of a cross-section of a damascene template suitable for use with the system of the present invention.

The present invention also contemplates the use of a highly reusable, relatively flat damascene template, such as those shown and described in U.S. Publication No. 2014/0318967, the contents of which are herein in corporate by reference. As shown in FIGS. 3A and 3B, a topographically flat damascene template 80 is shown and can be used to assist in the assembly and transfer of nanoelements formed from nanomaterial. Patterned assemblies of nanodevices such as nanoparticles and carbon nanotubes can be produced on the damascene template and transferred to desired locations on a receptor substrate, with resulting high density and good uniformity of the patterned nanoelements. The transfer of assembled SWNTs or other nanoelements onto a flexible substrate can be performed without any intermediate steps and without a need for sacrificial films. The illustrated damascene template 80 is reusable and can be employed in a high rate assembly and transfer process. Additionally, the damascene template 80 is compatible with various types of nanomaterials and nanoelements. The products and methods of the invention can provide advancements in high rate manufacturing of flexible devices, such as electrical and optical devices, such as display devices and strain gauges, as well as biosensors and chemical sensors. FIG. 3A is a schematic diagram of a damascene template fabrication process and FIG. 3B is a schematic representation of a cross-section of a suitable embodiment of the damascene template suitable for use with the present invention.

FIG. 3A is a schematic illustration of a process of forming a damascene template 80. Initially, a metallic layer (e.g., Au or W) is deposited on an electrically insulating substrate, and lithography is carried out to create a desired pattern for nanoelement assembly. Subsequently, partial etching of the metallic layer is conducted to form raised features having dimensions on the micrometer and/or nanometer scale. The raised features protrude above the plane of the rest of the metallic conductive layer. A thick layer of insulating material (e.g., $SiO_2$ or $SiN_4$) is blanket deposited on these patterned structures. A chemical mechanical polishing (CMP) process is then carried out to remove the insulating material until it is essentially coplanar with the top surfaces of the raised metal features, and until the top surfaces of the raised metal features are coplanar with one another across the substrate, or a portion of the substrate.

Thus, the resulting damascene template 80 has nano/micro features connected by a conductive film underneath an insulator (second insulating layer), which enables all of the micro/nano structures on the whole substrate, or a desired region of the substrate, to have equal potential during electrophoretic assembly. Preferred materials are gold for the metallic layer and PECVD-deposited silicon dioxide for the insulating layer.

FIG. 3B is a cross-sectional view of the damascene template 80 used with the current multi-scale manufacturing system 10. The template 80 includes a substrate 82 that forms a base layer and is formed of electrically insulating material, such as silicon or a suitable polymer material. The substrate 82 is essentially planar on at least one surface, or is entirely planar, and can be either generally or substantially rigid or can be flexible, so as to bend or conform to a desired shape. The substrate 82 can have any suitable size or shape required for the particular application, but generally has a thickness of between about 1 µm to about 10 or about 100 µm or less, or about 1000 µm or less, and a surface area on a planar surface of about 0.005 mm² or more, up to several cm². The substrate 82 can be fabricated from electrically insulating materials including silicon, silicon dioxide, organic polymers including epoxies and liquid crystal polymers, or a photoresist material such as SU-8.

The illustrated template 80 also includes a first insulating layer 84 formed on top of the substrate 82. The first insulating layer 84 can be formed from any suitable insulating material, such as $SiO_2$, $SiN_4$, or a polymer, which is deposited or induced to form on the surface of the substrate on which a conductive layer is deposited and nanoelements are assembled. The thickness of the first insulating layer 84 is, for example, in the range between about 10 nm to about 10 or between about 20 nm to about 1 or between about 30 nm to about 500 nm, or between about 5 nm to about 500 nm, or between about 40 nm to about 250 nm, or between about 50 nm to about 100 nm. The first insulating layer 84 can also be generally planar in structure and can extend over the entire substrate layer 82 or a portion of the substrate layer 82. The layer 84 prevents current leakage from an adjacent conductive layer 88 into the substrate 82 during electrophoretic assembly.

The template 80 also employs an optional adhesion layer 86 that is deposited onto the first insulating layer 84. The adhesion layer 86 provides improved adhesion of the conductive layer 88 to the first insulating layer 84, so that the conductive layer remains in place when voltage is applied to the conductive layer during electrophoretic assembly. Suitable materials for the adhesion layer 86 include chromium, titanium, titanium dioxide, titanium nitride, tantalum, tantalum nitride, tungsten, and combinations thereof. The thickness of the adhesion layer can be, for example, from about 3 nm to about 50 nm.

The damascene template 80 also includes a conductive layer 88 formed of a conductive metal that is deposited on the adhesion layer 86 if present or directly on the first insulating layer in embodiments with no adhesion layer. Suitable materials for the conductive layer 88 include metals such as gold, silver, tungsten, aluminum, titanium ruthenium, copper, and combinations or alloys thereof. The conductive layer 88 can include in essence two portions or layers, including a planar base layer having a thickness in the range between about 50 nm to about 100 and a plurality of raised features 92 which can extend at least temporarily during formation of the template above the plane of the base layer (for example, from about 10 nm to about 10 µm in height) and which have electrical continuity with one another through the base layer of the conductive layer.

A second insulating layer 94 can be formed and initially deposited over the entire conductive layer 88, including the raised features 92, and then planarized by chemical mechanical polishing so as to render coplanar the upper exposed surfaces of the second insulating layer 94 and the raised features. The thickness of the second insulating layer 94 can be, for example, from about 10 nm to about 10 µm and is generally about the same as the height of the raised metal features. In some embodiments, the thickness of the second insulating layer 94 and the raised features 92 is the same to within +1-1 µm, 100 nm, 10 nm or even 5 nm or 2 nm. The second insulating layer 94 fills the spaces between the raised features and provides electrical insulation in those regions which inhibits the assembly of nanoelements during electrophoretic assembly. Suitable materials for the second insulating layer include $SiO_2$, $SiN_4$, $Al_2O_3$, organic polymers, and combinations thereof.

In order to further inhibit nanoelement assembly in the insulated regions, those regions are preferably coated with a hydrophobic coating 96. The hydrophobic coating 96 is preferably a self-assembled monolayer (SAM) of an alkyl silane (which covalently bonds to $SiO_2$ if that material is used in the second insulating layer). The silane can be, for example, octadecyltrichlorosilane, or a similar silane having an alkyl chain of about 8-24 carbons in length. The preferred thickness of the hydrophobic coating 96 is one molecule, though it can also be more than one molecule. The purpose of the hydrophobic coating is to prevent the assembly of nanoelements on the exposed surface of the second insulating layer 94; as such, it only needs to render the exposed surface of the second insulating layer hydrophobic, and to be selectively bound to the second insulating layer and preferably not bound to the exposed surface of the conducting layer, where nanoelements are to be assembled. The hydrophobic coating has a contact angle from about 90° to about 110°, and preferably about 100°. In contrast, the exposed metal conductive layer surface has a contact angle of from 15° to 21°, and preferably about 18°.

Fabrication techniques for making the illustrated damascene template 80 are known to the skilled person. Such techniques as micro- and nanopatterning can be carried out by e-beam lithography, photolithography, and nano-imprint lithography. Deposition of metals can be performed by sputtering, chemical vapor deposition, or physical vapor deposition. Deposition of polymers and resists can be performed by spin coating. $SiO_2$ as the second insulating layer can be deposited by plasma enhanced chemical vapor deposition (PECVD). Etching of the second insulating layer and metal conductive layer can be by ion milling, ion-coupled plasma (ICP) and reactive ion etching (RIE). The two-dimensional pattern of the raised features of the metal conductive layer, and correspondingly the pattern of assembled nanoelements, can be any pattern that can be established using lithographic techniques, including linear features that are straight, curved, or intersecting as well as geometric shapes such as circles, triangles, rectangles, or dots. The raised features can have a width in the range from about 10 nm to about 100 µm, and a length from about 10 nm to several cm (e.g., the full diameter of a wafer).

The damascene template topography can impact the efficiency and yield of the assembly and transfer processes. Ideally a flat topography is used, which provides a uniform electric field from edge to the center of the electrodes, with minimal variation and facilitating uniform assembly. In addition, a non-flat topography can result in uneven transfer, creating indentations on the transfer substrate surface. To achieve a flat topography, the end point detection in the CMP process needs to be relatively precise. For example, sufficiently precise control can be achieved by determining the time period required for CMP based on the associated material removal rate.

Figure 4:
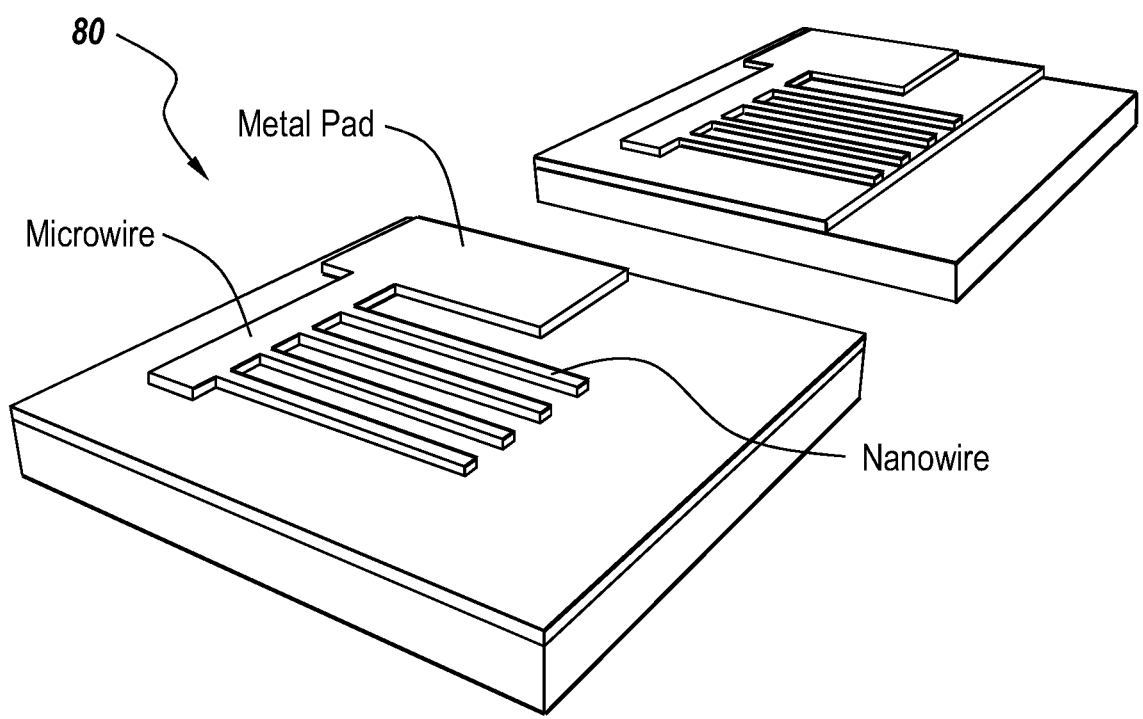
FIG. 4 is a schematic representation of another embodiment of a template suitable for use with the present invention.

As shown in FIG. 4, the damascene template for assembling nanoelements may involve both nanoscale and micron scale geometries and employ electrophoresis to drive directed assembly. That is, nanoscale and micron scale electrodes can be patterned on an insulator such that the nanoscale metal electrodes are connected to micron scale counterparts which are then connected to a large metal pad. During assembly using previous template designs, when a potential is applied to the large pad, there is a large potential drop across the length of the nanowires due to the increased resistivity of the nanoscale features. This potential drop has a significant impact on the assembly results, and can yield a non-uniform assembly on various portions of the template. With use of the illustrated damascene template, however, since all the nanoscale and micron scale electrodes are connected to the metal sheet underneath the insulator, when a potential is applied to the metal sheet during nanoelement assembly there is negligible variation in the electric potential between the micron scale and nanoscale electrodes.

Further details of the process and systems that can be employed to create the templates and nanostructures are set forth and illustrated in U.S. Pat. No. 8,784,673 of Xiong et al., U.S. Pat. No. 8,668,978 of Malima et al., and U.S. Pat. No. 8,703,501 of Mead et al., the contents of which are herein incorporated by reference. Electrophoresis is employed to achieve directed assembly of the nanoelements, while a transfer printing method is employed to transfer the assembled nanoelements onto the surface of the substrate.

With reference again to FIGS. 1 and 2, the manipulating component 16 then moves the template from the pre-alignment station 30 to the assembly station or subsystem 50. The assembly module includes a plurality of sections that are adapted to perform different processing steps. For example, the assembly module can include one or more tanks or reservoirs that can include a mixture that contains nanomaterial. According to the present invention, the manipulating component 16 transfers the template to the assembly module, where a second manipulating component 52 receives the template from the first manipulating component. The second manipulating component 52 orients the template so as to submerge the template into a first reservoir 54 that contains a nanomaterial solution. The solution can contain water and the nanomaterial, although solvents and solutions can also be used as would be obvious to one of ordinary skill in the art. The properties of the solution (such as pH) are adjusted such that the nanoelements have a selected charge. A DC voltage is applied between the template and a second counter electrode. The polarity of the applied voltage is opposite to that of the nanoelements or template. The electric field can be applied through the second manipulating component directly to the template and the second or counter electrode can be placed or disposed in the receptacle. The nanomaterial within the solution is deposited or attracted to selected surface features formed on or in the template through the applied electric field. The charged nanoelements are selectively assembled on the electrode surface and not on the insulator. With the potential still being applied, after assembly, the template and the counter electrode are withdrawn from the suspension in the first reservoir at a selected speed, such as a constant speed although the speed can also be variable. The potential is still applied to the template during withdrawal of the template from the receptacle or reservoir, since the hydrodynamic drag on the assembled nanoparticles is strong enough to remove them if the potential is not applied.

After the template is removed from the nanomaterial solution within the receptacle, the template is transferred to a dryer stage formed within a second tank or reservoir 56 of the assembly station 50 for drying the template after it is removed from the first receptacle 54. Once dried, the second manipulating component 52 transfers the template with nanomaterial back to the first manipulating component 16 where the template is once again transferred to the pre-alignment station 30. Once the template is pre-aligned, the template is then transferred to the alignment station 40 where it is accurately aligned with the substrate. This process is similar to the process employed during the manufacture of semiconductors. In the alignment station 40, the template and the substrate are aligned together.

Once the substrate and template are aligned together, the manipulating component 16 transfers the combined workpiece assembly (e.g., substrate and template) to the transfer station or subsystem 60. In the transfer station 60, a press system can be employed to press together the adjacent template and substrate of the workpiece assembly by applying a selected amount of heat and pressure. For example, the pressure can range between about 50 psi and about 100 psi. The forced mechanical contact between the two substrates allows the nanostructure formed on the template to be transferred to the receiving or transfer substrate. The transfer efficiency of the transfer printing process is primarily determined by the differential adhesion force between the template and the substrate. If the adhesion force between the nanoelement and template is smaller than the adhesion force between the nanoelement and substrate (or recipient) then the nanoelements are transferred onto the recipient surface. If the contrary is true, the nanoelements remain on the template surface after the transfer process. During transfer, the hydrophobic layer 96 plays the additional role of being an anti-stiction layer when the damascene template is separated from the flexible substrate during transfer. This transfer process does not significantly affect the template, which enables the damascene template to be reused for the assembly-transfer process without additional surface modification for at least several hundred cycles. Also, no additional processes such as stripping, patterning, or sacrificial layer removal/deposition are needed.

The template is then separated from the substrate, such as through selected air jets, and then the manipulating component 16 removes the substrate from the transfer station 60 and places the substrate with the corresponding nanostructure in the substrate storage and loading station 20 for storage and subsequent use.

Figure 5:
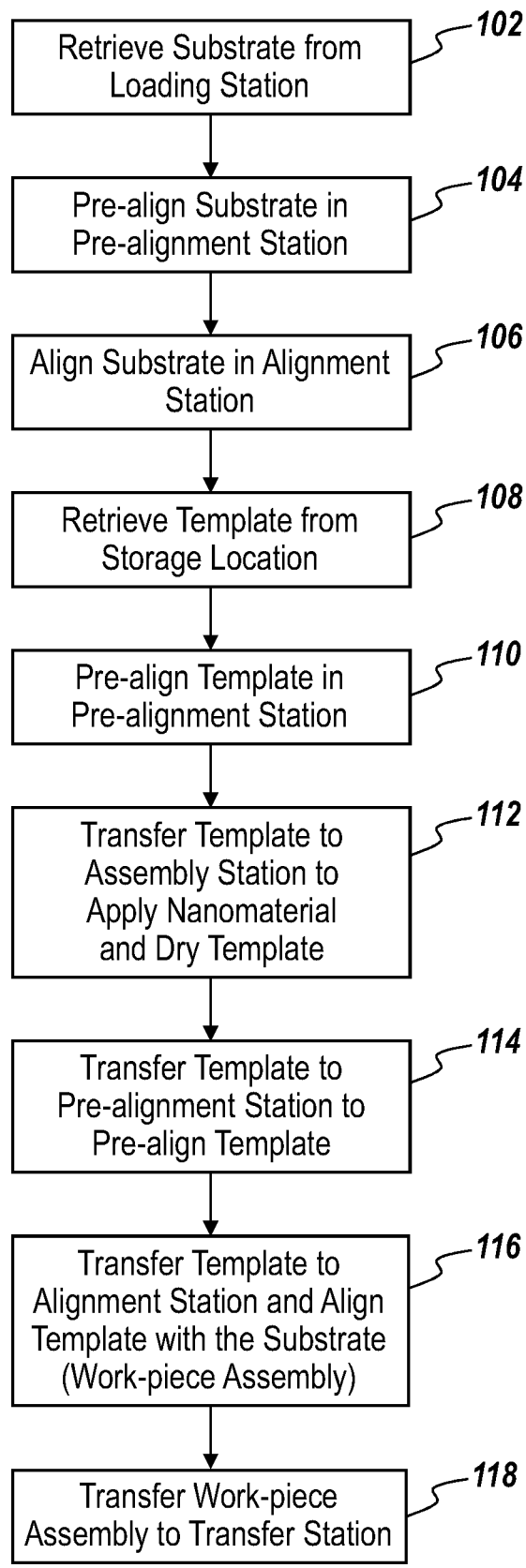
FIG. 5 is a schematic block diagram illustrating the processing steps for forming a nanodevice or an electronic device on a substrate or template.

FIG. 5 is a schematic block diagram representation setting forth the processing and fabrication steps involved in forming a nanostructure on a template, which is then transferred to a receiving substrate. At the outset, the manipulating component 16 of the multi-scale manufacturing system 10 retrieves a substrate from the loading station 20, step 102, and places the substrate in the pre-alignment station 20. The pre-alignment station 30 pre-aligns the substrate to a particular processing position according to known techniques, step 104. The manipulating component 16 then removes the substrate from the pre-alignment station and places the substrate in the alignment station 40, step 106. The substrate can be temporarily stored within the alignment station pending retrieval and processing of the template.

The manipulating component 16 of the manipulation station 12 then retrieves a template from a suitable template storage facility, such as from storage structure contained within the pre-alignment station, step 108. If the template is stored in the pre-alignment station, then the manipulating component 16 moves the template to the pre-alignment portion of the station 30 where the template is pre-aligned prior to further processing, step 110. The manipulating component 16 then retrieves the template and transfers the template to the assembly station 50. The assembly station 50 includes a housing having multiple tanks or reservoirs and a second manipulating component for receiving the template from the first manipulating component 16 of the manipulation station 12. The second manipulating component receives the template from the manipulating component 16, and then orients the template vertically for submersion in the first reservoir having a fluid and nanomaterial mixture contained therein. The second manipulating element can function as a first electrode and a second electrode can be electrically coupled to the first reservoir. The template is submerged in the fluid and an electric field created within the fluid between the two electrodes attracts the nanomaterial contained therein to selected pre-defined areas of the template. The second manipulating component then removes the template from the first reservoir and then translates the template horizontally until the template is positioned over a second adjacent reservoir. The second manipulating component then moves vertically downwardly placing the template in the second reservoir which functions as a drying stage. Air jets disposed within the reservoir air dry the template to remove any water therefrom, step 112.

The manipulating component 16 of the manipulation station 12 then retrieves the template from the assembly station 50 and then places the template within the pre-alignment station 30 so as to, once again, pre-align the template, step 114. The manipulating component 16 then transfers the template from the pre-alignment station 30 to the alignment station 40. In the alignment station, the template and the substrate are aligned with each other according to known techniques to form a workpiece assembly, step 116.

The manipulating component 16 then transfers the workpiece assembly to the transfer station 60, where the substrate and the template are pressed together employing suitable pressure applying techniques so as to transfer the nanomaterial from the template to the substrate, step 118. The substrate and the template are then separated by suitable structure within the transfer station and then the template and the substrate are separately transferred by the manipulating component back to the loading station 20.

One or more of the above-described acts or function steps can be encoded as computer-executable instructions executable by processing logic, e.g., in a programmed electronic device, such as provided in the control station 70. The computer-executable instructions may be stored on one or more non-transitory computer readable media. The electronic device may retrieve executable instructions from a computer-readable media and may execute the instructions using a processing device to perform one or more operations for implementing aspects of exemplary embodiments described herein. The electronic device may take many forms, including but not limited to a computing device, computer, workstation, server, network computer, optical computer, Internet appliance, mobile device, a tablet computer, application specific processing device, etc. For example, an alternative implementation of electronic device may have fewer components, more components, or components arranged in various configurations. The components of the computing device may be implemented using hardware based logic and/or logic that is a combination of hardware and software based logic (e.g., hybrid logic).

The computing device can include a processor that may include hardware based logic or a combination of hardware based logic and software to execute machine-readable instructions on behalf of any suitable electronic device. The processor may include logic that may interpret, execute, and/or otherwise process information contained in, for example, a memory element. The information may include computer-executable instructions and/or data that may implement one or more embodiments of the invention. The processor may also comprise a variety of homogeneous or heterogeneous hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), or other types of processing logic that may interpret, execute, manipulate, and/or otherwise process the information. The processor may include a single core or multiple cores. Moreover, the processor may include a system-on-chip (SoC) or system-in-package (SiP).

The electronic device may include one or more tangible non-transitory computer-readable storage media for storing one or more computer-executable instructions or software that may implement one or more embodiments of the invention. The non-transitory computer-readable storage media may be, for example, memory or storage. The memory may comprise a RAM that may include RAM devices that may store the information. The RAM devices may be volatile or non-volatile and may include, for example, one or more DRAM devices, flash memory devices, SRAM devices, zero-capacitor RAM (ZRAM) devices, twin transistor RAM (TTRAM) devices, read-only memory (ROM) devices, ferroelectric RAM (FeRAM) devices, magneto-resistive RAM (MRAM) devices, phase change memory RAM (PRAM) devices, or other types of RAM devices.

One or more electronic devices may include a virtual machine (VM) for executing the instructions loaded in memory. A virtual machine may be provided to handle a process running on multiple processors so that the process may appear to be using only one computing resource rather than multiple computing resources. Virtualization may be employed in the electronic device so that infrastructure and resources in electronic device may be shared dynamically. Further, as is known in the art, multiple VMs may be resident on a single electronic device.

The computing or electronic device may also include a network interface to interface to a Local Area Network (LAN), Wide Area Network (WAN) or the Internet through a variety of connections including, but not limited to, standard telephone lines, LAN or WAN links (e.g., T1, T3, 56 kb, X.25), broadband connections (e.g., integrated services digital network (ISDN), Frame Relay, asynchronous transfer mode (ATM), wireless connections (e.g., 802.11), high-speed interconnects (e.g., InfiniBand, gigabit Ethernet, Myrinet) or some combination of any or all of the above. The network interface may include a built-in network adapter, network interface card, personal computer memory card international association (PCMCIA) network card, card bus network adapter, wireless network adapter, universal serial bus (USB) network adapter, modem or any other device suitable for interfacing electronic device to any type of network capable of communication and performing the operations described herein.

The electronic device may include one or more input devices, such as a keyboard, a multi-point touch interface, a pointing device (e.g., a mouse), a gyroscope, an accelerometer, a haptic device, a tactile device, a neural device, a microphone, or a camera that may be used to receive input from, for example, a user. Note that the electronic device may include other suitable I/O peripherals. The input device may allow a user to provide input that is registered on a display device. A graphical user interface (GUI) may be shown on the display device.

A storage device may also be associated with the electronic device. The storage device may be accessible to the processor via an I/O bus. The information may be executed, interpreted, manipulated, and/or otherwise processed by the processor. The storage device may include, for example, a storage device, such as a magnetic disk, optical disk (e.g., CD-ROM, DVD player), random-access memory (RAM) disk, tape unit, and/or flash drive. The information may be stored on one or more non-transient tangible computer-readable media contained in the storage device. This media may include, for example, magnetic discs, optical discs, magnetic tape, and/or memory devices (e.g., flash memory devices, static RAM (SRAM) devices, dynamic RAM (DRAM) devices, or other memory devices). The information may include data and/or computer-executable instructions that may implement one or more embodiments of the invention. The storage device may be used for storing selected application software programs.

The storage device may further store applications, and the electronic device can be running any selected operating system (OS). Examples of suitable operating systems may include the Microsoft® Windows® operating systems, the Unix and Linux operating systems, the MacOS® for Macintosh computers, an embedded operating system, such as the Symbian OS, a real-time operating system, an open source operating system, a proprietary operating system, operating systems for mobile electronic devices, or other operating system capable of running on the electronic device and performing the operations described herein. The operating system may be running in native mode or emulated mode. The storage device may also store templates associated with applications. The templates associated with applications may be combined and the combination applied to a file or a file storage structure created using applications, as discussed herein.

Further, one or more embodiments of the invention may be implemented using computer-executable instructions and/or data that may be embodied on one or more non-transitory tangible computer-readable mediums. The mediums may be, but are not limited to, a hard disk, a compact disc, a digital versatile disc, a flash memory card, a Programmable Read Only Memory (PROM), a Random Access Memory (RAM), a Read Only Memory (ROM), Magnetoresistive Random Access Memory (MRAM), a magnetic tape, or other computer-readable media.

The control station can also form part of a network. The network may transport data from a source to a destination. Embodiments of suitable networks may use network devices, such as routers, switches, firewalls, and/or servers (not shown) and connections (e.g., links) to transport data. Data may refer to any type of machine-readable information having substantially any format that may be adapted for use in one or more networks and/or with one or more devices (e.g., electronic device, service provider, etc.). Data may include digital information or analog information. Data may further be packetized and/or non-packetized. The network may be a hardwired network using wired conductors and/or optical fibers and/or may be a wireless network using free-space optical, radio frequency (RF), and/or acoustic transmission paths. In one implementation, the network may be a substantially open public network, such as the Internet. In another implementation, the network may be a more restricted network, such as a corporate virtual network. The network may include Internet, intranet, Local Area Network (LAN), Wide Area Network (WAN), Metropolitan Area Network (MAN), wireless network (e.g., using IEEE 802.11), or other type of network.

The foregoing description may provide illustration and description of various embodiments of the invention, but is not intended to be exhaustive or to limit the invention to the precise form disclosed. Modifications and variations may be possible in light of the above teachings or may be acquired from practice of the invention. For example, while a series of acts has been described above, the order of the acts may be modified in other implementations consistent with the principles of the invention. No element, act, or instruction used in the description of the invention should be construed critical or essential to the invention unless explicitly described as such.

We claim:

1. A method for fabricating a nanostructure from nanomaterial, comprising
    providing a centrally located multi-axis and multi-dimensional first manipulating component associated with a housing for manipulating a substrate and a template,
    placing the substrate in a pre-alignment subsystem for pre-aligning the substrate,
    removing the substrate from the pre-alignment subsystem and the placing the substrate in an alignment subsystem,
    pre-aligning the template,
    removing the template from the pre-alignment subsystem and then transferring the template to an assembly subsystem,
    applying nanomaterial to the template in the assembly subsystem to form the nanostructure,
    drying the template once the nanomaterial is applied thereto in the assembly subsystem,
    removing the template from the assembly subsystem with the first manipulating component and then transferring the template to the alignment subsystem,
    aligning the template with the substrate to form a workpiece assembly,
    transferring the workpiece assembly with the first manipulating component from the alignment subsystem to a transfer subsystem,
    when in the transfer subsystem, transferring the nanomaterial from the template to the substrate and then separating the template from the substrate, with the first manipulating component, removing the substrate and the template from the transfer assembly, and controlling movement of the first manipulating component between the subsystems, wherein when the template is processed in the assembly subsystem, placing the template in a first reservoir containing the nanomaterial by a second manipulating component, removing the template from the first reservoir with the second manipulating component, translating the second manipulating component horizontally, placing the template in a second reservoir to air dry the template, removing the template from the second reservoir with the second manipulating component, and then transferring the template from the second manipulating component to the first manipulating component.

2. The method of claim 1, further comprising, when the workpiece assembly is processed in the transfer subsystem, applying pressure to the workpiece assembly so as to transfer the nanomaterial from the template to the substrate, and then applying air pressure between the template and the substrate so as separate the template from the substrate.

3. The method of claim 2, further comprising removing the substrate from the transfer subsystem with the first manipulating component and then transferring the substrate to a loading station.

4. The method of claim 3, further comprising removing the template from the transfer subsystem with the first manipulating component and then transferring the substrate to the loading station.

5. The method of claim 1, further comprising forming nanowells on the template for holding the nanomaterial.

6. The method of claim 1, further comprising clustering the pre-alignment subsystem, the alignment subsystem, the assembly subsystem and the transfer subsystem about the first manipulating component.

* * * * *